US012196787B2

(12) United States Patent
Ziglioli et al.

(10) Patent No.: US 12,196,787 B2
(45) Date of Patent: Jan. 14, 2025

(54) CURRENT TRANSDUCER

(71) Applicant: LEM International SA, Meyrin (CH)

(72) Inventors: Federico Giovanni Ziglioli, Geneva (CH); Stéphane Claeys, Chevrier (FR)

(73) Assignee: LEM International SA, Meyrin (CH)

( * ) Notice: Subject to any disclaimer, the term of this patent is extended or adjusted under 35 U.S.C. 154(b) by 118 days.

(21) Appl. No.: 18/017,251

(22) PCT Filed: Jul. 12, 2021

(86) PCT No.: PCT/EP2021/069363
§ 371 (c)(1),
(2) Date: Jan. 20, 2023

(87) PCT Pub. No.: WO2022/017857
PCT Pub. Date: Jan. 27, 2022

(65) Prior Publication Data
US 2023/0288453 A1  Sep. 14, 2023

(30) Foreign Application Priority Data

Jul. 24, 2020  (EP) .................................... 20187682

(51) Int. Cl.
*G01R 15/20* (2006.01)
(52) U.S. Cl.
CPC ......... *G01R 15/207* (2013.01); *G01R 15/202* (2013.01); *G01R 15/205* (2013.01)
(58) Field of Classification Search
CPC .. G01R 15/202; G01R 15/205; G01R 15/207; H01L 2224/48247; H01L 24/48;
(Continued)

(56) References Cited

U.S. PATENT DOCUMENTS 7,075,287 B1 *  7/2006  Mangtani ................ H01L 24/37
324/117 H
9,190,606 B2 *  11/2015  Liu ....................... H10N 52/101
(Continued)

OTHER PUBLICATIONS

International Search Report and Written Opinion as issued by the International Searching Authority, dated Sep. 17, 2021, for International Patent Application No. PCT/EP2021/069363; 15 pages.

*Primary Examiner* — Vinh P Nguyen
(74) *Attorney, Agent, or Firm* — Faegre Drinker Biddle & Reath LLP

(57) ABSTRACT

An open-loop electrical current transducer for surface mounting on an external circuit board, including an integrated circuit (IC) chip including a magnetic field sensing portion and connection terminals on a first active side of the IC chip, a lead frame arrangement including a primary conductor and a plurality of secondary conductors comprising IC connection portions, a plurality of bond wires interconnecting the IC connection portions to the connection terminals of the IC chip, and an insulating overmold housing overmolded over the IC chip, the bond wires, and a portion of the lead frame arrangement. The lead frame arrangement is formed from sheet metal having a base sheet of thickness B wherein at least portions of the lead frame arrangement include a thickness equal to the base sheet thickness B. The first active side of the IC chip faces the lead frame arrangement and at least a portion of the lead frame arrangement includes a thinned portion of thickness T between 20% and 80% of the base sheet thickness B, the thinned portion of thickness T including the IC connection portions of the secondary conductors.

20 Claims, 4 Drawing Sheets

(58) Field of Classification Search
CPC ............... H01L 23/48; H01L 23/49541; H01L 23/49575; H01L 2924/14; H01L 23/28; H01L 23/58; H01L 25/0655; H01L 27/14806; H01L 2924/3025
See application file for complete search history.

(56) References Cited

U.S. PATENT DOCUMENTS

| | | | |
|---|---|---|---|
| 9,958,482 B1 * | 5/2018 | Latham | ................ G01R 15/205 |
| 10,074,713 B1 * | 9/2018 | Briano | ................ H01L 23/642 |
| 10,345,343 B2 * | 7/2019 | Milano | ................ H10N 50/10 |
| 11,519,946 B1 * | 12/2022 | Rock | ................ G01R 19/1659 |
| 2006/0219436 A1 | 10/2006 | Taylor | |
| 2016/0282388 A1 | 9/2016 | Milano | |

* cited by examiner

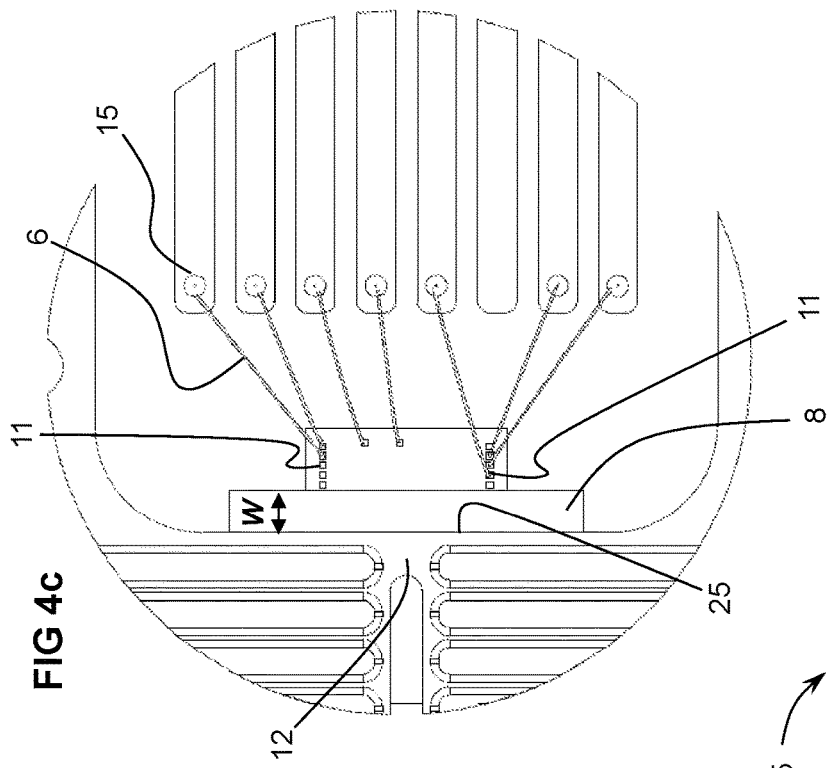
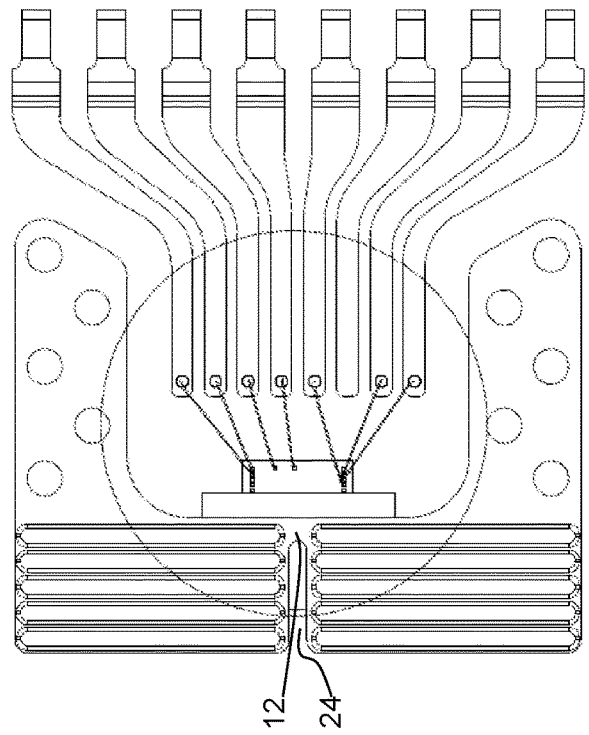
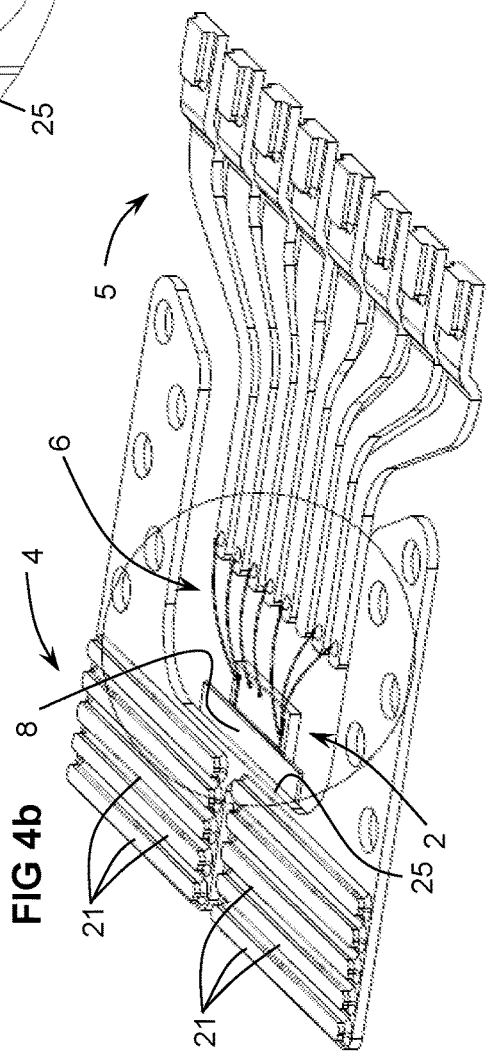

CURRENT TRANSDUCER

CROSS-REFERENCE TO RELATED APPLICATIONS

The present application is a national stage entry of International (PCT) Patent Application Number PCT/EP2021/069363, filed Jul. 12, 2021, which claims priority to European Patent Application Number 20187682.8, filed Jul. 24, 2020, the complete disclosures of which are expressly incorporated herein by reference.

The present invention relates to an open-loop current transducer for surface mounting on a circuit board.

It is known to provide open-loop current transducers having surface mount electrical connections for mounting on a circuit board. In many applications, there is an advantage in having a very compact and low height current transducer having an integrated primary conductor within an overmolded insulative housing. Such coreless current transducers may include an integrated circuit (IC) chip having an active sensing layer thereon detecting the magnetic field induced by a current to be measured flowing in a primary conductor integrated within the current transducer, the integrated circuit chip being electrically connected to secondary contacts that supply power and allow transmission of the measurement signal to the external circuit board.

It is well known to form the primary and secondary conductors from a lead frame. A lead frame is a strip of sheet metal that is stamped and formed to cut out primary and secondary contacts from the sheet metal, the contacts and integrated circuit being overmolded by an insulating polymer, connection ends of the contacts being exposed and configured for a solder or welding connection to circuit traces on the circuit board.

The electrical interconnection between the integrated circuit and the secondary contacts may be connected by a so-called "flip-chip" connection or by wire bonding. Active portions and connection interfaces on the semi-conductor substrate which, for instance a CMOS IC, are typically provided on a same single side of the IC. A flip-chip arrangement, for instance as described in US 2006/219436 A1, allows the active side to be facing and adjacent the lead frame conductor arrangement, allowing electrical interconnection between the lead frame and connection portions on the integrated circuit active surface, while at the same time having the active sensing portion of the integrated circuit being very close to the primary conductor. This provides greater sensitivity for measurement of the primary current due to the very small distance between the sensing layer and the primary conductor. Flip-chip connections can however be costly and complex to manufacture because of the small distances on the IC chip between connection points that need to be directly connected to the secondary conductors of the lead frame arrangement. There may also be disadvantages regarding electrical creepage distances that are more difficult to manage than in wire bond interconnections.

Wire bonding is a very common and widely used technique for interconnecting integrated circuits to conductors forming connection terminals for the IC chip. In conventional current transducers, a drawback of wire bonding interconnections between the IC chip and the lead frame arrangement is however the increased height compared to flip-chip arrangements due to the height of the interconnecting wire loops between the IC substrate and the lead frame conductors. Also, in conventional current transducers with wire bonding between the lead frame and IC chip, for instance as described in US 2016/282388 A1, the active sensor side faces away from the lead frame conductor arrangement in order to have the active surface accessible for the wire bonding between the lead frame terminals and the connection points on the IC circuit. There is thus a lower sensitivity compared to a flip-chip arrangement.

In view of the foregoing, it is an object of the present invention is to overcome the drawbacks of both conventional flip-chip and conventional wire bonded arrangements in open-loop current transducers for surface mount on circuit boards. In particular, it is an object of the invention to provide an open-loop current transducer for surface mounting on a circuit board that has a low height and high measurement sensitivity, yet that is economical to manufacture.

It is advantageous to provide an open-loop surface mount current transducer that is reliable, in particular ensuring good insulation properties between the IC chip and the integrated primary conductor.

Objects of the invention have been achieved by providing an open loop current transducer according to claim 1.

Disclosed herein is an open-loop electrical current transducer for surface mounting on an external circuit board, comprising an integrated circuit (IC) chip comprising
- a magnetic field sensing portion and connection terminals on a first active side of the IC chip,
- a lead frame arrangement comprising a primary conductor and a plurality of secondary conductors comprising IC connection portions,
- a plurality of bond wires interconnecting the IC connection portions to the connection terminals of the IC chip, and
- an insulating overmold housing overmolded over the IC chip, the bond wires, and a portion of the lead frame arrangement.

The lead frame arrangement is formed from sheet metal having a base sheet of thickness B wherein at least portions of the lead frame arrangement comprise a thickness equal to said base sheet thickness B. The first active side of the IC chip faces the lead frame arrangement and at least a portion of the lead frame arrangement comprises a thinned portion of thickness T between 20% and 80% of the base sheet thickness B, said thinned portion of thickness T including said IC connection portions of the secondary conductors.

In an advantageous embodiment, the IC chip is mounted partially overlapping a portion of the primary conductor including a sensing portion of the primary conductor, an insulating sheet mounted between the IC chip and primary conductor made of a material different from a material forming the insulating overmold housing, the connection terminals of the IC chip being provided on said portion of the IC chip not overlapping the primary conductor.

In an advantageous embodiment, said insulating foil extends beyond the portion of IC chip overlapping the primary conductor with a border of non-zero width W for increasing an electrical creepage distance between the primary conductor and IC chip.

In an advantageous embodiment, said insulating foil extends beyond an edge of the primary conductor over which the IC chip also extends in order to increase the creepage distance between the IC chip and the primary conductor.

In an advantageous embodiment, the sensing portion has a reduced current carrying cross-sectional area compared to surface mount connection terminals of the primary conductor between which the sensing portion is positioned and interconnected.

In an advantageous embodiment, the surface mount connection terminals of the primary conductor comprise a plurality of ridge portions.

In an advantageous embodiment, surface mount connection terminals of the secondary conductors are arranged in a row along a first edge of the overmold housing and the surface mount connection terminals of the primary conductor are arranged adjacent an opposed edge of the overmold housing.

In an advantageous embodiment, the thinned portion thickness T is in the range of 30% to 70% of base sheet thickness B. Preferably the thinned portion thickness T is in the range of 40% to 60% of base sheet thickness B.

In an advantageous embodiment, the primary conductor comprises one or more heat sink extensions serving as heat sinks extending from the surface mount connection terminals thereof.

In an advantageous embodiment, the one or more heat sink extensions extend from the primary conductor surface mount connection terminals towards the surface mount connection terminals of the secondary conductors.

In an advantageous embodiment, there are a pair of heat sink extensions, one for extending from each surface mount connection terminal of the primary conductor Further objects and advantageous features of the invention will be apparent from the claims, from the detailed description, and annexed drawings, in which:

FIG. 4a is a plan view and FIG. 4b a perspective view of another embodiment of the current transducer according to the invention, with the overmold housing removed, and FIG. 4c is an enlarged view of a portion of FIG. 4a.

Figure 1B:
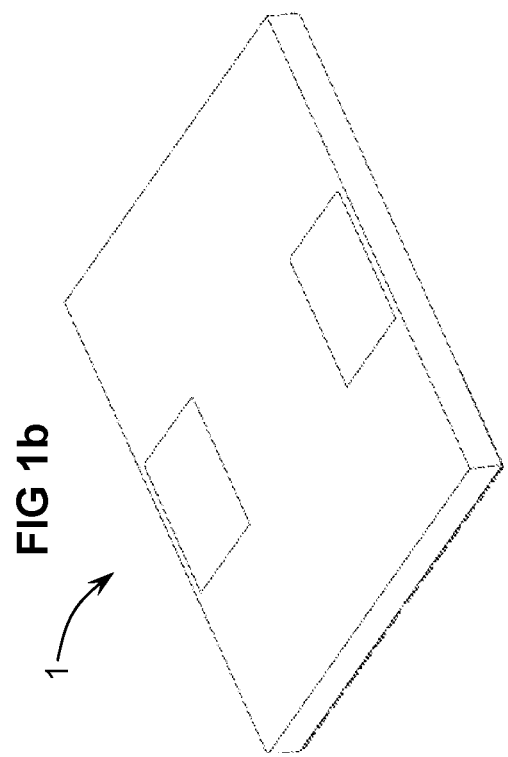
FIGS. 1a to 1c are perspective views of a surface mount open-loop current transducer according to an embodiment of the invention, FIG. 1c showing an overmold housing portion partially cut away.
Figure 1A:
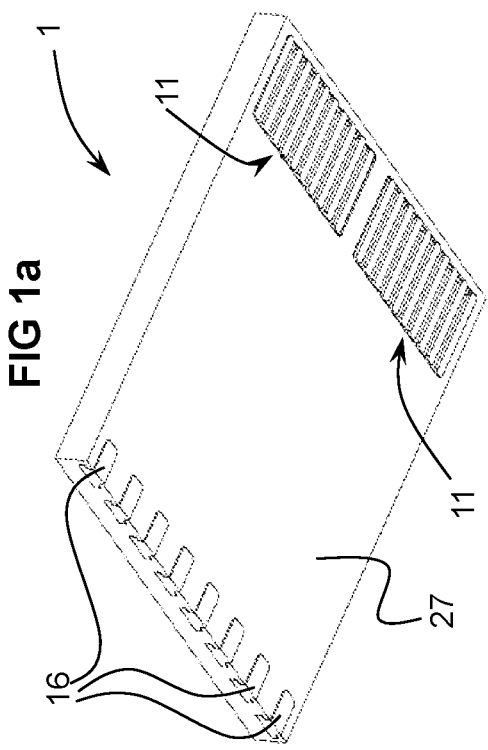
Figure 1C:
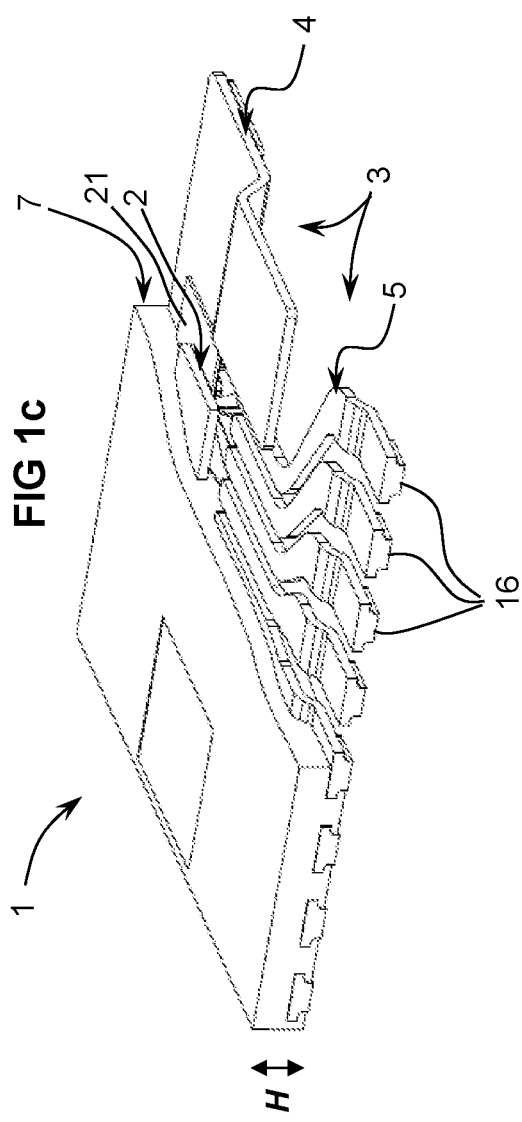

Referring to the figures, an electric current transducer 1 for surface mount connection on an external circuit board comprises a magnetic field sensor 2 connected to a lead frame arrangement 3 housed within an insulating overmold housing 7.

The magnetic field sensor 2 is in the form of an integrated circuit (IC) chip having a first active side 9a and a second side 9b, at least the first active side 9a having active portions including electrical connection terminals 11 for connection to power and signal transmission conductors and a magnetic field sensor portion 10 arranged at or close to the surface of the first side. The chip may be attached to the lead frame with a glue layer between the face 9a and the insulating layer 8. The insulating layer 8 may be attached to the lead frame with a glue layer.

The magnetic field sensing portion 10 may comprise a Hall effect sensor, or a giant magneto-resistive sensor or other forms of magnetic field sensors that are per se well known in the art. The IC chip 2 may for instance be in the form of a CMOS chip although other types of semi-conductor integrated circuit chips with magnetic field sensing portions per se known in the art may be used. The semiconductor chip does not need to be further described, such semi-conductor chips with magnetic field sensing portions and connection terminals being per se well known in the art.

The lead frame arrangement 3 comprises a primary conductor 4 and a plurality of secondary conductors 5. The lead frame arrangement is formed from a sheet of conductive metal, more specifically in the form of a band or strip that is stamped and formed in a stamping and forming process to cut out, bend and/or emboss the sheet metal to form the primary and secondary conductors. Stamping and forming of lead frame arrangements from sheet metal are per se well known techniques. Sheet metal used in such arrangements has initially a constant thickness that we shall name herein "base sheet thickness" having a thickness B. In conventional lead frame arrangements stamped and formed from sheet metal, the primary and secondary conductors comprise generally throughout essentially the base sheet thickness B except for slight variations due to a bending operation if the portions of the conductors are bent out of the original plane of the sheet metal, for instance to form contact terminals. The base sheet thickness B is an important characteristic of the mechanical rigidity of the contact terminals especially if they protrude out of the overmold housing. Even in arrangements where the contact terminals are flush with or embedded in the overmold housing such that only a contact pad surface is exposed, the base thickness may be needed at least around connection ends for secure anchoring to the housing and coupling to the external circuit board conductive pad to which it is welded or soldered. The thickness of the sheet metal also affects the cross-section of the conductors, in particular the primary conductor and thus the current carrying capability of the conductors of the lead frame arrangement.

The IC chip 2 also has a certain thickness and the overmold housing 7 molded around the lead frame conductor arrangement 3 and the IC chip 2 also requires a certain thickness to insulate these components from the external environment.

There is however a desire to have a transducer with a very low height H for integration on a circuit board since in many applications the overall height of the electronic components which include the circuit board should be as small as possible.

According to the invention, at least a portion of the secondary conductors 5 has thinned portions of a thickness T that is in a range between 20% and 80% the base thickness B, preferably in a range from 30% to 70%, more preferably in a range from 40% to 60% for reasons that will be described in more detail hereafter.

The primary conductor comprises a pair of surface mount connection terminals 13 configured for surface mount connection to conductive traces on an external circuit board, and a sensing portion 12 interconnecting the pair of surface mount connection terminals 13. The sensing portion 12 comprises a reduced conductive cross-sectional area in order to concentrate for the current to be measured (the primary current) and increase the intensity of the magnetic field around the sensing portion 12. The reduced cross-sectional area of the sensing portion 12 may for instance be formed by providing a slot 24 in the primary conductor between the connection terminals 13.

The IC chip 2 is positioned in a partially overlapping relationship over the sensing portion 12. In particular, the magnetic field sensing portion 10 of the IC chip is positioned preferably in an overlapping relationship with the sensing portion 12 of the primary conductor so that the magnetic field sensing portion 10 is positioned very close to the sensing portion 12 of the primary conductor.

An insulating sheet 22 is positioned between a portion of the primary conductor 4 encompassing the sensing portion 12 and the IC chip 9. The insulating sheet 8 may for instance be in the form of a sheet of polymeric materials such as polyimide, in single or multiple layers, or may be as well a small sheet of glass that defines the gap between the IC chip active sensing side 9a and the primary conductor, and that provides insulation between the primary conductor and IC chip. The insulating sheet 8 extends over the primary conductor 4 to an extent greater than the IC chip 2 to form a border of minimum width W therearound so as to increase the creepage distance between the IC chip and the primary conductor. The semi-conductor IC chip only partially overlaps the primary conductor, a portion of the IC chip comprising the connection terminals 11 extending beyond an inner edge 25 of the primary conductor 4 such that the connection portions do not overlap the primary conductor and are accessible for connection to bond wires 6. The insulating sheet 8 also advantageously extends beyond the inner edge 25 of the primary conductor such that the foil only partially overlaps the primary conductor, here also to increase the electrical creepage distance between the IC chip 2 and the primary conductor 4. The IC chip is oriented such that the active sensing portions faces the primary conductor to be as close as possible to the primary conductor for maximizing the signal measurement.

The secondary conductors 5 which serve to interconnect the IC chip 2 to power and signal connections of an external circuit to which the current transducer is intended to be connected, comprise a plurality of conductors formed from the lead frame arrangement as previously discussed, each secondary conductor comprising an IC connection portion 15 on one end and the surface mount connection terminal 16 at the other end. The surface mount connection terminal 16 may be for instance arranged in a row presenting contact pads intended for surface mount solder or welding connection, as per se known in the art, to circuit traces of an external circuit board. The surface mount connection terminals 16 are thus positioned proximate an outer edge of the transducer overmold housing 7, the IC connection portions 15 being positioned proximate the IC chip 2 allowing bond wire connections between the IC chip 2 and the IC connection portions 15 of the secondary conductors. The IC connection portions 15 of the secondary conductors are spaced closer together than the surface mount connection terminals 13 that fan outwardly from the IC connection portions.

Bond wires 6 are connected between the IC connection portions 15 of each secondary conductor 5 and connection terminals 11 on the IC chip 2. It may be noted that certain secondary conductors may have no connection to the IC chip, forming a redundant secondary conductor for use with semi-conductor chips with more connection portions. In other words, the number of connections depend on the functions incorporated in the IC chip. The lead frame conductor arrangement 3 may have a constant configuration, whereas the number of wire bond interconnections between the secondary conductors and IC chip may depend on the configuration of the IC chip and desired functionalities to be incorporated in the transducer.

Figure 2:
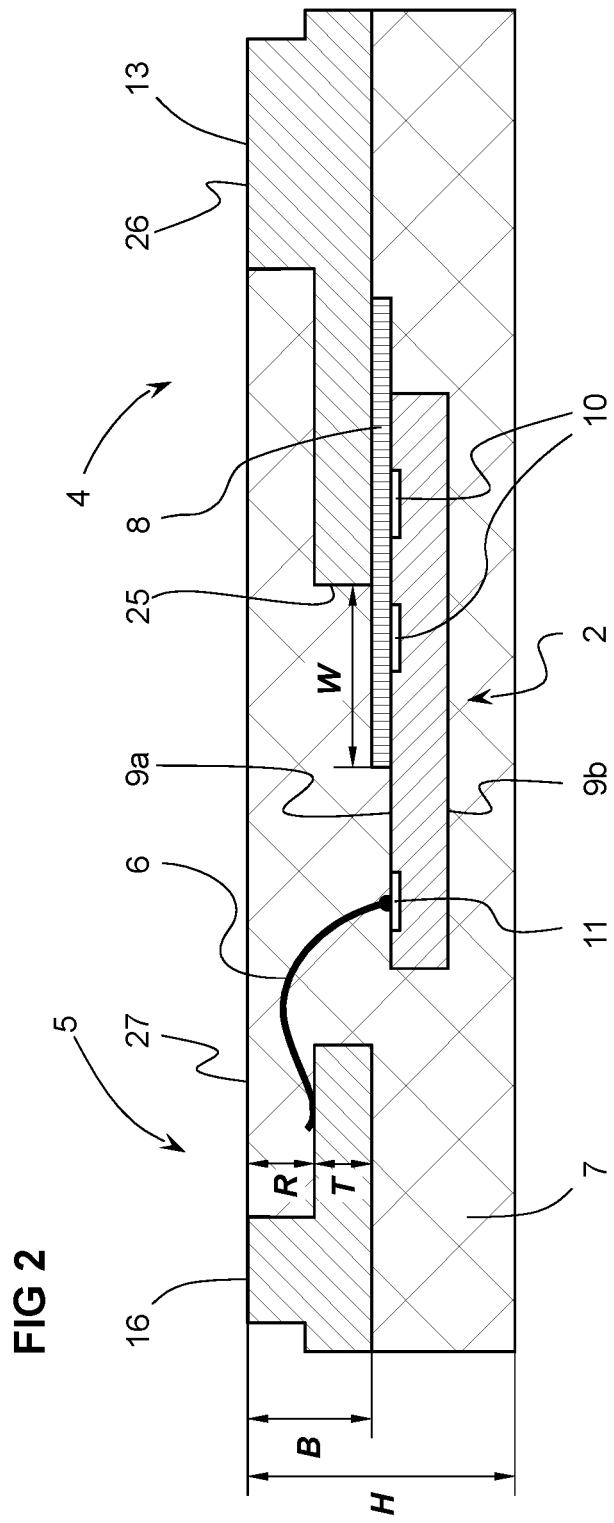
FIG. 2 is a schematic cross-sectional view of a current transducer according to an embodiment of the invention.
Figure 3B:
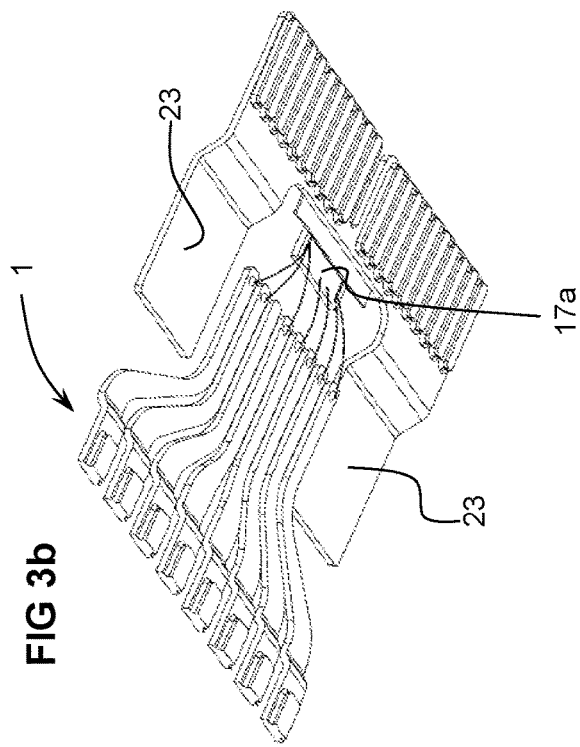
FIGS. 3a and 3b are perspective views and FIG. 3c is a plan view of the current transducer of FIGS. 1a to 1c with the overmold housing removed.
Figure 3A:
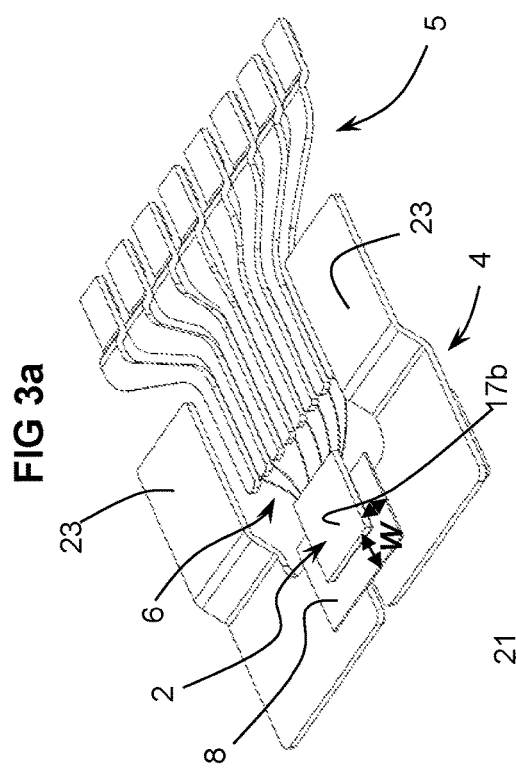
Figure 3C:
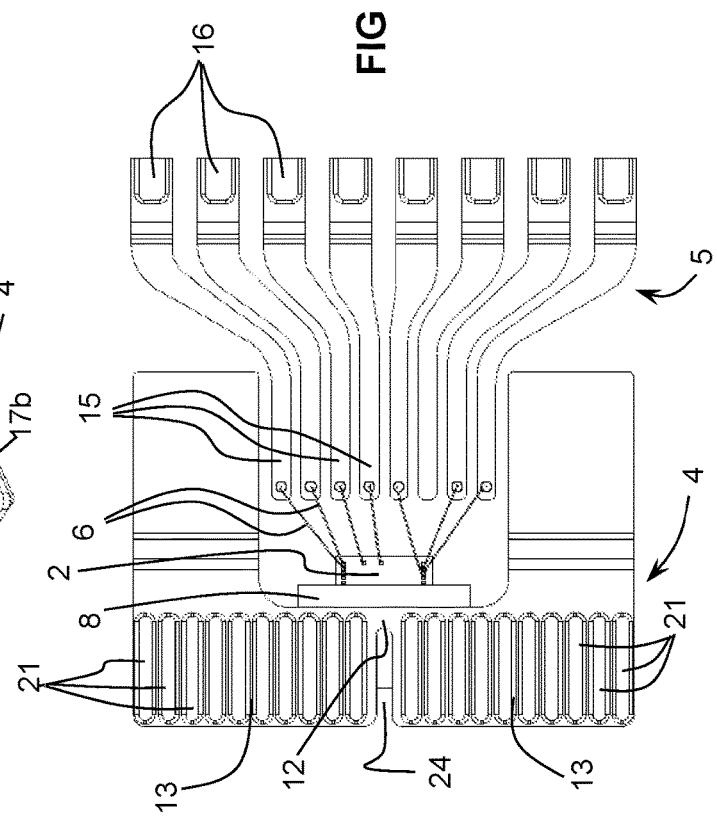

According to the invention, at least a portion of the secondary conductors encompassing the IC connection portions 15 have a thinned portion of reduced thickness T that, as previously mentioned, is in a range of 20% to 80% of base thickness B preferably in a range of 30% to 70% m more preferably in a range of 40% to 60%. The reduced thickness of the IC connection portions 15 allows the bond wires 6 to have a reduced loop height with respect to the outermost surface 26 of the lead frame arrangement 3 facing away from the IC chip 2, thus allowing a lower overall height H of the overmold housing 7. Although in the schematically illustrated embodiment of FIG. 2, the loop height of the bond wire is fully within the recess formed by the thinned portion T, the bond wire 6 may have a portion that extends above the recess. Nevertheless, the portion extending above the recess will be less than in conventional arrangements in which the loop of the bond wire will be yet further distanced from the outer surface of the lead frame. Advantageously also, the bond wires 6 are mounted and connected to the IC chip 2 and secondary conductors 5 on the same side of the transducer as the surface mount connection terminals 13 of the primary conductor 4 and the surface mount connection terminals 16 of the secondary conductors 5.

The surface mount connection terminals 13, 16 may be embossed or stamped in an offset plane from a plane of the lead frame arrangement including the IC connection portions 15 of the secondary conductors so as to present terminals flush with or extending beyond a mounting side surface 27 of the overmold housing 7. The lead frame may be plated as well with any suitable wire bondable layer in accordance with the bond wire used.

The thinned portion thickness T of the lead frame arrangement surrounding at least the IC connection portions 15 of the secondary conductors may be formed by an etching process, for instance a chemical or laser etching process, such processes being per se known in the field of etching metallic conductive materials. Other process examples may comprise coining or embossing.

It may be noted that the thinned portion thickness T may extend over a large portion of the lead frame arrangement, including up to all of the lead frame arrangement except for the surface mount connection terminals 13, 16 of the primary and secondary conductors.

In embodiments, the surface mount connection terminals 13 of the primary conductor may advantageously comprise a plurality of ridge portions 21 that may, for instance be embossed by stamping of the sheet metal or may be formed in an etching process out of the base thickness of the sheet metal. The ridge portions 21 advantageously improve the solder connection to complementary circuit traces on an external circuit board, to improve the mechanical and electrical connection between the primary conductor and the circuit traces on the external circuit board. The improved connection may also improve thermal transfer when the current transducer is used for measurement of high intensity currents (relative to the size of the transducer). Nevertheless, in variants the connection portions 13 may comprise only a few or only a single connection pad per connection side.

The primary conductor 4 may further comprise extensions 23 extending from the surface mount connection terminals 13, that serve as a heat sink and that may optionally be configured for thermal coupling to an external heat sink. The heat sink may also be simply integrated in the current transducer forming a large surface to improve heat transfer out of the primary conductor when large currents (relative to the size of the transducer) are flowing through the transducer.

LIST OF REFERENCES USED electric current transducer 1
magnetic field sensor 2 (integrated circuit (IC) chip)
first side (active sensing side) 9a
magnetic field sensing portion 10
connection terminals 11
second side 9b
Lead frame arrangement 3
primary conductor 4
sensing portion 12 slot 24
inner edge 25
surface mount connection terminals 13
ridge portions 21
secondary conductors 5
IC connection portion 15
surface mount connection terminals 16
first (bonding wire) side 17a
second (die mounting) side 17b
base sheet portion 18
thinned portion 19
bond wire connection recess 20
etched recess
Insulating sheet 8
Bond wires 6
Overmold housing 7
mounting side surface 27
base sheet thickness B
thinned portion thickness T
recess thickness R

The invention claimed is:

1. An open-loop electrical current transducer for surface mounting on an external circuit board, comprising an integrated circuit (IC) chip comprising a magnetic field sensing portion and connection terminals on a first active side of the IC chip, a lead frame arrangement comprising a primary conductor and a plurality of secondary conductors comprising IC connection portions, a plurality of bond wires interconnecting the IC connection portions to the connection terminals of the IC chip, and an insulating overmold housing overmolded over the IC chip, the bond wires, and a portion of the lead frame arrangement, the lead frame arrangement formed from sheet metal having a base sheet of thickness B wherein at least portions of the lead frame arrangement comprise a thickness equal to said base sheet thickness B, wherein the first active side of the IC chip faces the lead frame arrangement and at least a portion of the lead frame arrangement comprises a thinned portion of thickness T between 20% and 80% of the base sheet thickness B, said thinned portion of thickness T including said IC connection portions of the secondary conductors.

2. The current transducer according to claim 1, wherein the IC chip is mounted partially overlapping a sensing portion of the primary conductor, wherein an insulating sheet mounted between the IC chip and the primary conductor is made of a material different from a material forming the insulating overmold housing, the connection terminals of the IC chip being provided on the portion of the IC chip not overlapping the primary conductor.

3. The current transducer according to claim 1, wherein the thinned portion thickness T is in the range of 30% to 70% of the base sheet thickness B.

4. The current transducer according to claim 3, wherein the thinned portion thickness T is in the range of 40% to 60% of the base sheet thickness B.

5. An open-loop electrical current transducer for surface mounting on an external circuit board, comprising an integrated circuit (IC) chip comprising a magnetic field sensing portion and connection terminals on a first active side of the IC chip, a lead frame arrangement comprising a primary conductor and a plurality of secondary conductors comprising IC connection portions, a plurality of bond wires interconnecting the IC connection portions to the connection terminals of the IC chip, and an insulating overmold housing overmolded over the IC chip, the bond wires, and a portion of the lead frame arrangement, the lead frame arrangement formed from sheet metal having a base sheet of thickness B wherein at least portions of the lead frame arrangement comprise a thickness equal to said base sheet thickness B, wherein the first active side of the IC chip faces the lead frame arrangement and at least a portion of the lead frame arrangement comprises a thinned portion of thickness T between 20% and 80% of the base sheet thickness B, said thinned portion of thickness T including said IC connection portions of the secondary conductors, wherein the IC chip is mounted partially overlapping a sensing portion of the primary conductor, wherein an insulating sheet mounted between the IC chip and the primary conductor is made of a material different from a material forming the insulating overmold housing, the connection terminals of the IC chip being provided on the portion of the IC chip not overlapping the primary conductor, and wherein said insulating sheet extends beyond the portion of the IC chip overlapping the primary conductor with a border of non-zero width W for increasing an electrical creepage distance between the primary conductor and the IC chip.

6. The current transducer according to claim 5, wherein said insulating sheet extends beyond an edge of the primary conductor over which the IC chip also extends in order to increase the creepage distance between the IC chip and the primary conductor.

7. The current transducer according to claim 5, wherein the sensing portion has a reduced current carrying cross-sectional area compared to surface mount connection terminals of the primary conductor.

8. The current transducer according to claim 7, wherein the surface mount connection terminals of the primary conductor comprise a plurality of ridge portions.

9. The current transducer according to claim 7, wherein surface mount connection terminals of the secondary conductors are arranged in a row along a first edge of the overmold housing and the surface mount connection terminals of the primary conductor are arranged adjacent an opposed edge of the overmold housing.

10. The current transducer according to claim 5, wherein the thinned portion thickness T is in the range of 30% to 70% of the base sheet thickness B.

11. The current transducer according to claim 10, wherein the thinned portion thickness T is in the range of 40% to 60% of the base sheet thickness B.

12. The current transducer according to claim 7, wherein the primary conductor comprises one or more heat sink extensions serving as heat sinks extending from the surface mount connection terminals thereof.

13. The current transducer according to claim 12, wherein the one or more heat sink extensions extend from the primary conductor surface mount connection terminals towards the surface mount connection terminals of the secondary conductors.

14. The current transducer according to claim 12, wherein there are a pair of said heat sink extensions, one for extending from each surface mount connection terminal of the primary conductor.

15. An open-loop electrical current transducer for surface mounting on an external circuit board, comprising an integrated circuit (IC) chip comprising a magnetic field sensing portion and connection terminals on a first active side of the IC chip, a lead frame arrangement comprising a primary conductor and a plurality of secondary conductors comprising IC connection portions, a plurality of bond wires interconnecting the IC connection portions to the connection terminals of the IC chip, and an insulating overmold housing overmolded over the IC chip, the bond wires, and a portion of the lead frame arrangement, the lead frame arrangement formed from sheet metal having a base sheet of thickness B wherein at least portions of the lead frame arrangement comprise a thickness equal to said base sheet thickness B, wherein the first active side of the IC chip faces the lead frame arrangement and at least a portion of the lead frame arrangement comprises a thinned portion of thickness T between 20% and 80% of the base sheet thickness B, said thinned portion of thickness T including said IC connection portions of the secondary conductors, wherein the IC chip is mounted partially overlapping a sensing portion of the primary conductor, wherein an insulating sheet mounted between the IC chip and the primary conductor is made of a material different from a material forming the insulating overmold housing, the connection terminals of the IC chip being provided on the portion of the IC chip not overlapping the primary conductor, and, wherein the sensing portion has a reduced current carrying cross-sectional area compared to surface mount connection terminals of the primary conductor.

16. The current transducer according to claim 15, wherein the surface mount connection terminals of the primary conductor comprise a plurality of ridge portions.

17. The current transducer according to claim 15, wherein surface mount connection terminals of the secondary conductors are arranged in a row along a first edge of the overmold housing and the surface mount connection terminals of the primary conductor are arranged adjacent an opposed edge of the overmold housing.

18. The current transducer according to claim 15, wherein the primary conductor comprises one or more heat sink extensions serving as heat sinks extending from the surface mount connection terminals thereof.

19. The current transducer according to claim 18, wherein the one or more heat sink extensions extend from the primary conductor surface mount connection terminals towards the surface mount connection terminals of the secondary conductors.

20. The current transducer according to claim 18, wherein there are a pair of said heat sink extensions, one for extending from each surface mount connection terminal of the primary conductor.

* * * * *